«12» United States Patent
Harris

(10) Patent No.: US 8,457,936 B2
(45) Date of Patent: Jun. 4, 2013

(54) APPARATUS AND METHODS FOR SIMULATING A SYSTEM STEADY STATE DEVOID OF PERFORMING FULL TRANSIENT OPERATING CONDITIONS

(75) Inventor: Oswald George Harris, Tempe, AZ (US)

(73) Assignee: Honeywell International Inc., Morristown, NJ (US)

( * ) Notice: Subject to any disclaimer, the term of this patent is extended or adjusted under 35 U.S.C. 154(b) by 445 days.

(21) Appl. No.: 12/276,878

(22) Filed: Nov. 24, 2008

(65) Prior Publication Data

US 2010/0131252 A1    May 27, 2010

(51) Int. Cl.
G06G 7/48    (2006.01)

(52) U.S. Cl.
USPC .................................. 703/6; 703/13

(58) Field of Classification Search
USPC .................................. 703/6, 7, 13
See application file for complete search history.

(56) References Cited

U.S. PATENT DOCUMENTS

| | | |
|---|---|---|
| 4,423,594 A | 1/1984 | Ellis |
| 5,091,843 A | 2/1992 | Peczkowski |
| 5,913,184 A | 6/1999 | Girbig |
| 6,278,899 B1 | 8/2001 | Piche et al. |
| 6,304,835 B1 | 10/2001 | Hiramatsu et al. |
| 6,823,675 B2 | 11/2004 | Brunell et al. |
| 7,016,779 B2 | 3/2006 | Bowyer |
| 7,058,556 B2 | 6/2006 | Desai et al. |
| 7,219,040 B2 | 5/2007 | Renou et al. |
| 7,383,167 B2 | 6/2008 | Oke |
| 7,714,529 B2 * | 5/2010 | Chen et al. ............ 318/712 |
| 7,853,392 B2 * | 12/2010 | Healey et al. .......... 701/100 |
| 2006/0282242 A1 | 12/2006 | Parsons et al. |
| 2007/0126592 A1 | 6/2007 | Littrell |
| 2007/0168057 A1 | 7/2007 | Blevins et al. |
| 2007/0179763 A1 | 8/2007 | Perchanok et al. |
| 2007/0282487 A1 | 12/2007 | Kirchhof |
| 2008/0178600 A1 | 7/2008 | Healy et al. |

* cited by examiner

Primary Examiner — Omar Fernandez Rivas
Assistant Examiner — Herng-Der Day
(74) Attorney, Agent, or Firm — Ingrassia Fisher & Lorenz, P.C.

(57) ABSTRACT

Apparatus and methods for simulating a steady state condition for an unknown variable in a system are provided. One apparatus includes a processor and memory configured to store a model of the system, and first and second predictions modules. The model is configured to receive a plurality of fixed inputs representing known variables for the model, the first prediction module is configured to generate an open loop prediction for the unknown variable based on the fixed inputs, and the second prediction module is configured to generate a closed loop prediction for the unknown variable based on the open loop prediction. A method includes the steps of receiving a plurality of fixed inputs in the system model, generating an open loop prediction for the unknown variable based on the plurality of fixed inputs, and generating a closed loop prediction for the unknown variable based on the open loop prediction.

17 Claims, 3 Drawing Sheets

US 8,457,936 B2

APPARATUS AND METHODS FOR SIMULATING A SYSTEM STEADY STATE DEVOID OF PERFORMING FULL TRANSIENT OPERATING CONDITIONS

FIELD OF THE INVENTION

The present invention generally relates to simulators, and more particularly relates to apparatus and methods for simulating a system steady state without having to perform the full transient operating conditions for the system.

BACKGROUND OF THE INVENTION

Current apparatus and methods for simulating performance of a system usually have to perform several steps simulating the transient conditions for the system prior to reaching the steady state condition for one or more unknown parameters in the system. Even though these apparatus and methods usually provide accurate steady state results, because current apparatus and methods simulates the transient conditions for the system, these apparatus and methods often take a comparatively large amount of time to reach the steady state condition for the unknown parameters.

Accordingly, it is desirable to provide apparatus and methods for simulating a steady state condition for an unknown variable in a system. In addition, it is desirable that these apparatus and methods reach an accurate steady state condition for the unknown variable in a smaller amount of time than currently-used apparatus and methods. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Various embodiments provide apparatus for simulating a steady state condition for an unknown variable in a system. One system comprises a processor and memory coupled to the processor. The memory is configured to store a model of the system configured to receive a plurality of fixed inputs representing known variables for the model, a first prediction module, and a second prediction module. The first prediction module is configured to generate an open loop prediction for the unknown variable based on the plurality of fixed inputs when executed by the processor, and the second prediction module configured to receive the open loop prediction and generate a closed loop prediction for the unknown variable based on the open loop prediction when executed by the processor.

Also provided are apparatus for simulating a steady state condition for an unknown variable in a system model. One method comprising the steps of receiving a plurality of fixed inputs in the system model, the fixed inputs representing known variables in the system model, and generating an open loop prediction for the unknown variable based on the plurality of fixed inputs. The method further comprises the step of generating a closed loop prediction for the unknown variable based on the open loop prediction.

Machine-readable mediums comprising instructions, which when executed by a processor, cause the processor to perform a method for simulating a steady state condition for an unknown variable in a system model are also provided. One method comprising the steps of receiving a plurality of fixed inputs in the system model, the fixed inputs representing known variables in the system model, and generating an open loop prediction for the unknown variable based on the plurality of fixed inputs. The method further comprises the step of generating a closed loop prediction for the unknown variable based on the open loop prediction.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Various embodiments of the invention provide apparatus and methods for simulating a steady state condition for an unknown variable in a system. In addition, the apparatus and methods of the various embodiments reach an accurate steady state condition for the unknown variable in a shorter amount of time than currently-used apparatus and methods.

Figure 1:
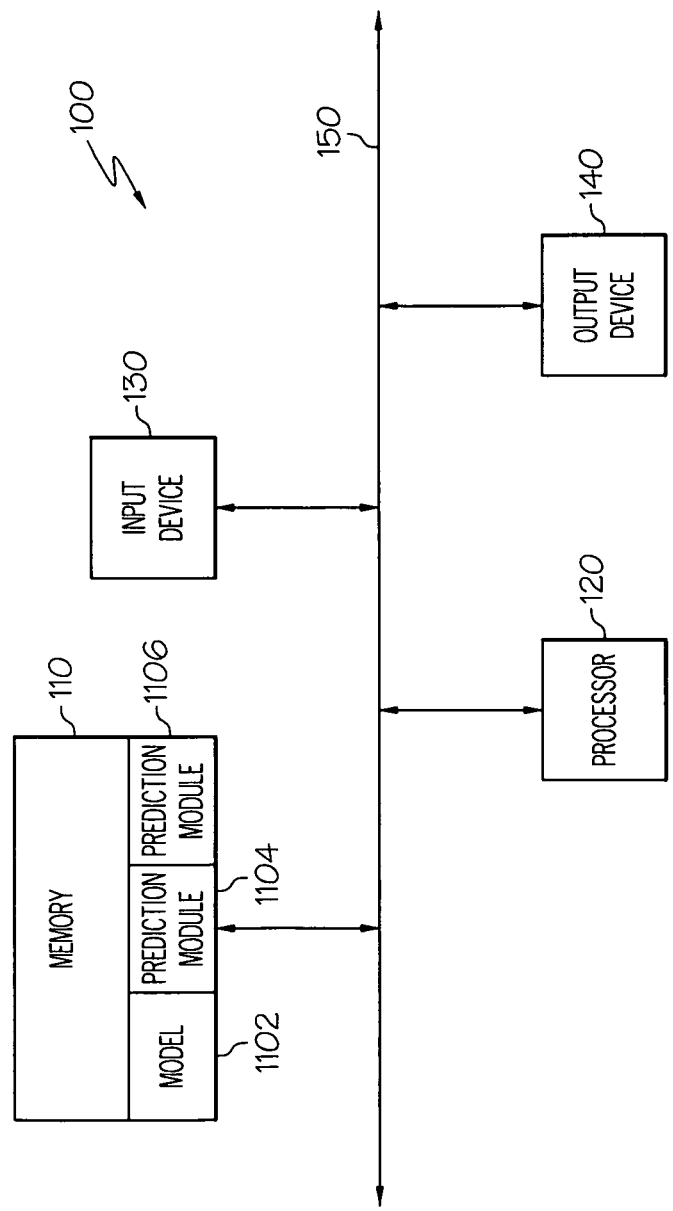
FIG. 1 is a block diagram of one embodiment of an apparatus for simulating a steady state condition for an unknown variable in a system.

Turning now to the figures, FIG. 1 is a block diagram of one embodiment of an apparatus 100 for simulating a steady state condition for an unknown variable in a system. At least in the embodiment illustrated in FIG. 1, apparatus 100 comprises memory 110 storing a model 1102 of the system and a plurality of prediction modules 1104 and 1106, a processor 120, an input device 130 (e.g., a keyboard, mouse, etc.), and an output device 140 (e.g., a computer display, printer, etc.) coupled to one another via a bus 150 (e.g., a wired and/or wireless bus).

Memory 110 may be any system, device, hardware, or combinations thereof capable of storing model 1102 and prediction modules 1104, 1106. That is, memory 110 may be any machine-readable medium capable of storing instructions, which when executed by processor 120, will cause processor 120 to perform the operations of model 1102 and prediction modules 1104, 1106 discussed below.

Model 1102 may be any hardware and/or software set of instructions capable of modeling of the operations/functionality of a particular system. In one embodiment, model 1102 is a model of a gas turbine engine when the system is, for example, a gas turbine engine. Model 1102, in other embodiments, may be the model of any type of system capable of being modeled. That is, model 1102 may be any type of system model capable of receiving one or more system inputs and generating one or more values representing system outputs that are consistent with the operations/functionality of the system based on the one or more system inputs. The system outputs of model 1102 may then be used as inputs to prediction module 1104.

Prediction module 1104 may be any hardware and/or software set of instructions capable of generating an open loop prediction for one or more unknown variables in the system. In one embodiment, prediction module 1104 is an open loop prediction module configured to receive the system outputs of model 1102 and generate an open loop prediction for the one or more unknown variables in the system based on the received system outputs. In another embodiment, prediction module 1104 is configured to receive one or more system outputs representing the outputs of a gas turbine engine and generating an open loop prediction for one or more unknown variables in the gas turbine engine based on the received system outputs. The open loop prediction(s) from prediction module 1104 may then be used as inputs to prediction module 1106.

Prediction module 1106 may be any hardware and/or software set of instructions capable of generating a closed loop prediction of the one or more unknown variables in the system. In one embodiment, prediction module 1106 is a closed loop prediction module configured to receive the open loop prediction(s) from prediction module 1104 and generate a closed loop prediction for the one or more unknown variables in the system based on the received open loop prediction(s). In another embodiment, prediction module 1106 is configured to perform a plurality of computational iterations in generating the closed loop prediction such that the closed loop prediction includes a steady state error of zero or substantially zero. Prediction module 1106, in yet another embodiment, is configured to generate the closed loop prediction to a predetermined or specified degree of accuracy. In still another embodiment, prediction module 1106 is configured to receive one or more open loop predictions representing the open loop prediction for one or more unknown variables in a gas turbine engine and generating a closed prediction for the one or more unknown variables in the gas turbine engine based on the received open loop prediction(s).

Processor 120 may be any system, device, hardware, or combinations thereof capable of executing the set of instructions contained in model 1102 and prediction modules 1104, 1106. Specifically, processor 120 may be any system, device, hardware, or combinations thereof capable of receiving the system inputs for model 1102 from a user (via input device 130), executing the set of instructions comprising model 1102, executing the set of instructions comprising prediction module 1104, executing the set of instructions comprising prediction module 1106, and commanding output device 140 to display the closed loop predictions generated by prediction module 1106. In one embodiment, processor 120 is a proportional plus integral (P+I) controller. In embodiments in which processor 120 is a P+I controller, processor 120 comprises delta correction and/or theta correction algorithms for properly calculating the closed loop prediction.

Processor 120, in one embodiment, is configured to execute the set of instructions comprising model 1102, prediction module 1104, and prediction module 1106 to generate the closed loop prediction for one or more unknown variables in the modeled system in less than about 30 seconds. In another embodiment, processor 120 is configured to execute the set of instructions comprising model 1102, prediction module 1104, and prediction module 1106 to generate the closed loop prediction for one or more unknown variables in the modeled system in less than about 10 seconds.

Figure 2:
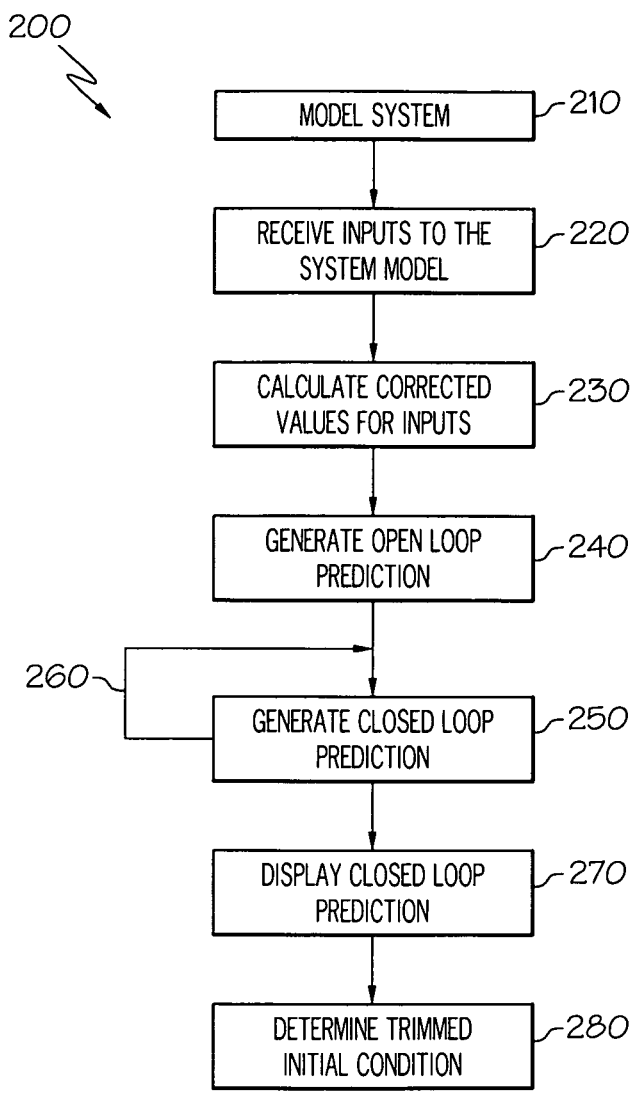
FIG. 2 is a flow diagram illustrating one embodiment of a method for simulating a steady state condition for an unknown variable in a system.

FIG. 2 is a flow diagram illustrating one embodiment of a method 200 for simulating a steady state condition for an unknown variable in a system. At least in the embodiment illustrated in FIG. 2, method 200 begins by modeling the operations/functionality of a particular system to generate a model (e.g., model 1102) of the system (step 210).

The model receives one or more inputs representing desired parameters/outputs for the actual system (step 220) and calculates one or more corrected values representing the actual outputs of the system based on the received inputs (step 230). The corrected values/system outputs are input into a prediction module (e.g., prediction module 1104) to generate an open loop prediction for one or more unknown variables based on the corrected values/system outputs (step 240). The open loop prediction is subsequently transmitted to a second prediction module (e.g. prediction module 1106) for processing.

The second prediction module receives the open loop prediction and generates a closed loop prediction based on the received open loop prediction (step 250). In one embodiment, the second prediction module performs a plurality of computational iterations in generating a steady state closed loop prediction (step 260). In another embodiment, the second prediction module performs the plurality of computational iterations until the steady state error in the closed loop prediction is zero (step 260). In other words, the second prediction module is configured to generate the closed loop prediction to a predetermined or specified degree of accuracy. Once generated, the closed loop prediction is then displayed to user (step 270) and the closed loop prediction may be used to determine a "trimmed" condition for the actual system (step 280).

Figure 3:
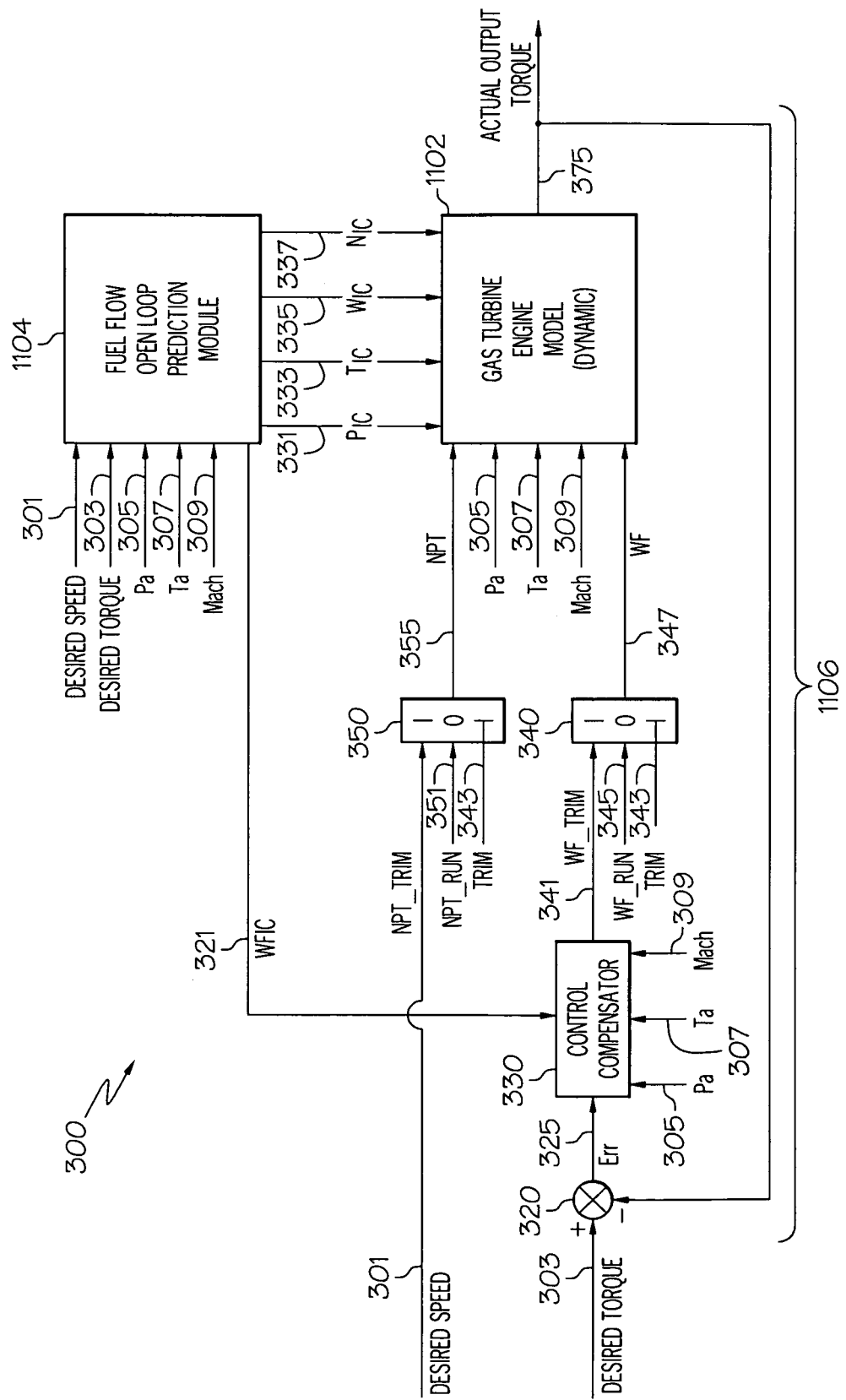
FIG. 3 is a block diagram illustrating one embodiment of the apparatus of FIG. 1 for simulating a steady state condition for fuel flow in a gas turbine engine.

FIG. 3 is a block diagram illustrating one embodiment of apparatus 100 for simulating a steady state condition for fuel flow (i.e., the unknown variable) in a gas turbine engine (i.e., the system). In the embodiment illustrated in FIG. 3, model 1102 is a dynamic model of the gas turbine engine, prediction module 1104 is a fuel flow open loop prediction module, and prediction module 1106 is a fuel flow closed loop prediction module.

Prediction module 1104 is configured to receive a desired turbine speed input 301, a desired torque input 303, an ambient pressure ($P_a$) input 305, an ambient temperature ($T_a$) input 307, and a Mach Number (Mach) input 309 that is the velocity of the air flow to the actual engine. Prediction module 1104 is configured to use inputs 301, 303, 305, 307, and 309, to calculate an open loop prediction 321 of the fuel flow initial condition ($WF_{IC}$), or an open loop estimate of the rate of fuel flow needed to produce the desired turbine speed and desired torque for the given input conditions. Open loop prediction 321 is then transmitted to a control compensator 330 (e.g., a P+I controller).

Control compensator 330 is configured to receive open loop prediction 321, $P_a$ input 305, $T_a$ input 307, Mach input 309, and an error signal 325 (discussed below), and generate a closed loop prediction 341 of the fuel flow (WF_TRIM) based on inputs 305, 307, and 309, open loop prediction 321, and error signal 325. That is, control compensator 330 is configured to generate one or more closed loop predictions 341 until error signal 325 includes a value less than or equal to a predetermined error value, wherein closed loop prediction 341 is the fuel flow rate that satisfies the desired turbine speed and desired output torque for the given ambient conditions. After each closed loop prediction 341 is generated, each closed loop prediction 341 is transmitted to a trim switch 340.

Trim switch 340 is configured to provide model 1102 with either closed loop prediction 341 or a run fuel flow (WF_RUN) input 345 depending on the status of a trim input 343. Specifically, when trim input 343 is a logic one (1), closed loop prediction 341 is the WF input 347 transmitted to model 1102. Similarly, when Trim input 343 is a logic zero (0), WF_RUN input 345 is the WF input 347 transmitted to model 1102.

System 300 also includes a trim switch 350 that operates similar to trim switch 340. That is, trim switch 350 is configured to provide model 1102 with either desired speed input 301 (NPT_TRIM) or a run speed (NPT_RUN) input 351 depending on the status of Trim input 343. Specifically, when Trim input 343 is a logic one (1), desired speed input 301 is the NPT input 355 transmitted to model 1102. Similarly, when Trim input 343 is a logic zero (0), NPT_RUN input 351 is the NPT input 355 transmitted to model 1102.

Model 1102 is configured to receive inputs representing the initial conditions calculated by prediction module 1104 for engine state pressures ($P_{IC}$) 331, temperatures ($T_{IC}$) 333, air flows ($W_{IC}$) 335, and gas producer speed ($N_{IC}$) 337. Model 1102 also receives NPT input 355 and WF input 347 from trim switches 350 and 340, respectively, and further receives $P_a$ input 305, $T_a$ input 307, and Mach input 309.

With inputs 305, 307, 309, 331, 333, 335, 337, 347, and 355, model 1102 is configured to generate an actual torque output 375, which is then used by prediction module 1106 in generating closed loop prediction 341. Specifically, actual torque output 375 is transmitted to an adder 320.

Adder 320 is configured to determine the difference in the actual torque output 375 and the desired torque input 303, and generate error signal 325 in response thereto. That is, error signal 325 represents the difference between the desired amount of torque and the actual amount of torque produced for the given fuel flow input (i.e. closed loop prediction 341 used as WF input 347).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

The invention claimed is:

1. A computing system for simulating a steady state condition for a variable in a system, the computing system comprising:
   a processor comprising a controller; and
   memory coupled to the processor and configured to store:
      a model of the system, the model configured to generate one or more corrected values representing first system outputs of the model based on a plurality of fixed inputs representing known variables for the model;
      a first prediction module, the first prediction module configured to receive the one or more corrected values and to generate an open loop prediction of an initial condition for the variable based on the received one or more corrected values; and
      a second prediction module, the second prediction module configured to receive the open loop prediction of the initial condition for the variable and to generate a closed loop prediction simulating the steady state initial condition for the variable by the controller based on the received open loop prediction, at least one second system output of the model, and at least some of the plurality of fixed inputs;
      wherein the model further configured to receive the closed loop prediction from the controller of the second prediction module, to receive the at least some of the plurality of fixed inputs, and to generate the at least one second system output of the model.

2. The computing system of claim 1, wherein the second prediction module is further configured to generate the closed loop prediction to a specified degree of accuracy.

3. The computing system of claim 2, wherein the second prediction module is further configured to generate the closed loop prediction within a specified period of time.

4. The computing system of claim 1, wherein the first prediction module is configured to generate a prediction of a steady state value for each corrected value.

5. The computing system of claim 1, wherein the controller is a proportional plus integral (P+I) controller.

6. The computing system of claim 5, wherein the P+I controller is configured to use delta correction, theta correction, or both.

7. The computing system of claim 6, wherein the P+I controller is configured to calculate the closed loop prediction until an iteration of the closed loop prediction includes a steady state error of zero.

8. A method for electronically simulating a steady state condition for a variable in a system model on a processor comprising a controller, the method comprising the steps of:
   receiving a plurality of fixed inputs, the plurality of fixed inputs representing known variables in the system model;
   generating one or more corrected values representing first system outputs of the system model based on the received plurality of fixed inputs;
   generating initial system conditions and an open loop prediction of an initial condition for the variable based on the generated one or more corrected values by a first module;
   generating a closed loop prediction simulating the steady state initial condition for the variable by the controller of a second module based on the generated open loop prediction, at least one second system output of the system model, and at least some of the plurality of fixed inputs, and
   generating the at least one second system output by the system model based on the generated closed loop prediction from the controller of the second module, the initial system conditions received from the first module, and the at least some of the plurality of fixed inputs.

9. The method of claim 8, wherein the closed loop prediction is generated to a specified degree of accuracy.

10. The method of claim 9, wherein the closed loop prediction is generated within a specified period of time.

11. The method of claim 8, wherein the step of generating the open loop prediction comprises the step of generating a prediction of a steady state value for each corrected value.

12. The method of claim 8, wherein the step of generating the closed loop prediction comprises the step of calculating the closed loop prediction until an iteration of the closed loop prediction includes a steady state error at or below a predetermined value.

13. A non-transitory machine-readable medium comprising instructions, which when executed by a processor comprising a controller, cause the processor to perform a method for simulating a steady state condition for a variable in a system model comprising the steps of:
   receiving a plurality of fixed inputs, the plurality of fixed inputs representing known variables in the system model;

generating one or more corrected values representing first system outputs of the system model based on the received plurality of fixed inputs;

generating initial system conditions and an open loop prediction of an initial condition for the variable based on the generated one or more corrected values by a first module;

generating a closed loop prediction simulating the steady state initial condition for the variable by the controller of a second module based on the generated open loop prediction, at least one second system output of the system model, and at least some of the plurality of fixed inputs, and generating the at least one second system output by the system model based on the generated closed loop prediction from the controller of the second module, the initial system conditions received from the first module, and the at least some of the plurality of fixed inputs.

14. The machine-readable medium of claim 13, wherein the instructions for generating the closed loop prediction comprise instructions that, when executed by the processor, cause the processor to perform the step of generating the closed loop prediction to a specified degree of accuracy.

15. The machine-readable medium of claim 14, wherein the instructions for generating the closed loop prediction further comprise instructions that, when executed by the processor, cause the processor to perform the step of generating the closed loop prediction within a specified period of time.

16. The machine-readable medium of claim 13, wherein the instructions for generating the closed loop prediction further comprise instructions that, when executed by the processor, cause the processor to perform the step of generating a prediction of a steady state value for each corrected value.

17. The machine-readable medium of claim 15, wherein the instructions for generating the closed loop prediction further comprise instructions that, when executed by the processor, cause the processor to perform the step of calculating the closed loop prediction until an iteration of the closed loop prediction includes a steady state error at or below a predetermined value.

* * * * *